United States Patent
Leong et al.

(10) Patent No.: US 6,468,831 B2
(45) Date of Patent: Oct. 22, 2002

(54) METHOD OF FABRICATING THIN INTEGRATED CIRCUIT UNITS

(75) Inventors: Chew Weng Leong; Chee Kiang Yew; Min Yu Chan; Pang Hup Ong; Jeffrey Tuck Fook Toh; Boon Pew Chan, all of Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/808,987

(22) Filed: Mar. 16, 2001

(65) Prior Publication Data

US 2002/0000648 A1 Jan. 3, 2002

Related U.S. Application Data

(62) Division of application No. 09/145,378, filed on Sep. 1, 1998, now Pat. No. 6,274,929.

(51) Int. Cl.[7] .............................................. H01L 21/44
(52) U.S. Cl. ........................ 438/108; 438/118; 438/125; 438/613; 257/686; 257/724; 257/738; 257/783; 228/180.22
(58) Field of Search ................................. 438/107, 108, 438/109, 106, 118, 119, 121, 124, 125, 126, 612, 613; 257/737, 738, 778, 685, 686, 723, 724, 782, 783, 787; 228/180.22; 156/60

(56) References Cited

U.S. PATENT DOCUMENTS

| | | | | |
|---|---|---|---|---|
| 4,827,082 A | * | 5/1989 | Horiuchi et al. | 174/52.4 |
| 5,674,785 A | | 10/1997 | Akram et al. | 438/15 |
| 5,838,061 A | * | 11/1998 | Kim | 257/686 |
| 5,854,507 A | * | 12/1998 | Miremadi et al. | 257/686 |
| 5,883,426 A | * | 3/1999 | Takuno et al. | 257/686 |
| 5,973,392 A | | 10/1999 | Senba et al. | 257/686 |
| 6,020,629 A | | 2/2000 | Farnworth et al. | 257/686 |
| 6,025,648 A | | 2/2000 | Takahashi et al. | 257/778 |
| 6,072,233 A | | 6/2000 | Corisis et al. | 257/686 |
| 6,137,164 A | | 10/2000 | Yew et al. | 257/686 |
| 6,188,127 B1 | * | 2/2001 | Senba et al. | 257/686 |
| 6,274,929 B1 | * | 8/2001 | Leong et al. | 257/724 |

FOREIGN PATENT DOCUMENTS

JP  8-236694  9/1996

* cited by examiner

*Primary Examiner*—David E. Graybill
*Assistant Examiner*—Alonzo Chambliss
(74) *Attorney, Agent, or Firm*—Wade James Brady III; Frederick J. Telecky, Jr.

(57) ABSTRACT

A high density unit (130, 160) comprising a first integrated circuit package (30, 32) comprising a carrier (70) having first and second sides (92, 94), a silicon chip (50) attached by an adhesive layer (60) and solder bonding (80) electrically connecting the silicon chip (50) to the carrier (70) stackably and electrically connected to a second integrated circuit package (30, 32), is disclosed.

9 Claims, 2 Drawing Sheets

METHOD OF FABRICATING THIN INTEGRATED CIRCUIT UNITS

This application is a division of Ser. No 09/145,378, filed Sep. 1, 1998 now U.S. Pat. No. 6,274,929.

TECHNICAL FIELD OF THE INVENTION

The present invention relates in general to the field of integrated circuit packaging and, more specifically, can relate to integrated circuit packages and a method for producing the same wherein the integrated circuit packages are electrically connected to one another to form a memory unit for use in attachment to a printed circuit board to form a module.

BACKGROUND OF THE INVENTION

Without limiting the scope of the invention, its background is described in connection with integrated circuit packages and memory modules, as an example.

Heretofore, in this field, integrated circuits have been formed on semiconductor wafers, which are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are generally packaging related.

The integrated circuit must be packaged in a suitable media that will protect it in subsequent manufacturing steps and from the environment of its intended application. Wire bonding and encapsulation are the two main steps in the packaging of individual integrated circuit packages. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

SUMMARY OF THE INVENTION

Commonly, integrated circuit packages are attached printed circuit boards to form single inline memory modules, which are typically referred to as SIMMs. SIMMs may, for example, be used to increase the memory of, typically, personal computers. The amount of the memory on the SIMM, however, is generally limited by surface area of the mother or sister printed circuit board that supports the integrated circuit packages. As memory demands increase, so has the need for increased Input/Output (I/O) capacity and memory capacity of SIMMs. Efforts to enhance these capacities, however, have been limited by the amount or space available in the environment in which the modules operate.

Therefore, it is recognized herein that a need has arisen for a module (e.g. a memory module) and a process for producing a module that meets the present and future needs for expansion within the same limited space. Furthermore, a need has arisen for high density module and a process for producing high density modules that provide for attachment modules of integrated circuit packages to form modules. A need has also arisen for materials and methods that lead to increases, e.g., in I/O and/or memory capacity. Further, a need has arisen for a double-sided integrated circuit package, and modules made of the same, that provides protection to the wire bonding and silicon chip during subsequent manufacturing and testing steps and from the environment of its intended purpose.

The present invention disclosed herein comprises an apparatus and method of stacking double sided integrated circuit packages into an integrated circuit unit. The integrated circuit module protects the integrated circuit packages that make up the integrated circuit module during manufacturing and testing steps and from the environment of its intended purpose. The integrated circuit packages are stackably mounted together to form an integrated circuit unit and can be attached to a printed circuit mother or sister board to form a high density module.

The present invention comprises at least a first integrated circuit package and a second integrated circuit package that are stackably and electrically connected together to form an integrated circuit unit. Even though the invention is described in terms of first and second integrated circuit packages for simplicity and convenience, it is to be understood that any number of integrated circuit packages may be stacked to form the integrated circuit unit using the materials and techniques described herein. For example, seven to nine integrated circuit packages may be stacked to form an integrated circuit memory unit in accordance with the present invention.

The first and second integrated circuit packages each include a carrier having first and second surfaces. A plurality of routing strips are integral with the carrier and extend into the opening. At least three terminals are disposed on the first and second surfaces. Two rows of terminals may be provided for on the first and second surfaces of the carrier to provide separate electrical connections to integrated circuit packages that are electrically upstream from lower packages. In some cases, integrated circuit packages that are part of the same integrated circuit unit but have distinct functionality, but are upstream from lower integrated circuit packages, may be electrically isolated from internal terminals that connect lower integrated circuit packages. At least one of the terminals disposed on the first surface and at least one of the terminals disposed on the second surface are electrically connected with at least one of the routing strips. The first and second integrated circuit packages also include at least one via electrically connecting the terminals disposed on the first surface with the terminals disposed on said second surface.

A chip is adhered to each of the carriers on either the first or second surfaces depending on the positioning of routing strips on or in the carrier. Each chip has bonding pads disposed thereon. Solder balls or bumps form solder bonding that electrically connects the bonding pads to the routing strips. An adhesive layer or underfill fills the space between the silicon chip and the carrier that does not contain solder bonding. By using solder balls to interconnect the silicon chip with the carrier the overall profile or height of the integrated circuit package, unit and/or module of the present invention is significantly reduced. Reductions from 20 to 40 percent of the overall profile are achieved depending on the number and thickness of the integrated circuit packages that are used to form the integrated circuit unit and/or module of the present invention.

The integrated circuit packages further include bus bars being integral with the carriers and extending to the solder bonding. The bus bar electrically connects at least one of the bonding pads of the chip to at least one the terminals disposed on the first and the second surfaces of the carrier.

The integrated circuit unit is formed by electrically connecting at least one of the terminals disposed on the second surface of the first integrated circuit package with at least one of the terminals disposed on the first surface of the second integrated circuit package. In one embodiment, solder balls are used to make the electrical connection between the first and second integrated circuit packages. In another embodiment, solder columns are used to make the electrical connection between the first and second integrated circuit packages.

The integrated circuit unit may further include additional integrated circuit packages stackably and electrically connected together, for example, a third integrated circuit package may be stackably and electrically connected to the second integrated circuit package and a fourth integrated circuit package may be stackably and electrically connected to the third integrated circuit package.

Once the integrated circuit units are constructed, they may be attached to a printed circuit mother or sister circuit board to form, for example, a module. In this way, the number of integrated circuit packages stacked at a given location on the module may be increased, thus enabling a higher density module. Furthermore, the integrated circuit module can be handled and packaged as a single item during processing, rather that handling and packaging a number individual integrated circuit packages.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention can be related to integrated circuits using a board-on-chip design having a double sided carrier to achieve high speed performance and to meet the space constraint requirements of modern semiconductors. The principles of the present invention may be incorporated into, for example, a synchronous DRAM (SDRAM) silicon chip. The present invention, however, is also applicable to LOGIC, SRAM, EPROM and any other integrated circuit components.

Figure 1:
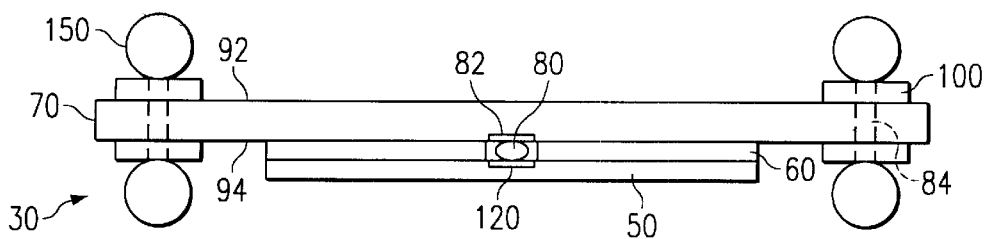
FIG. 1 is a simplified end cross-sectional view of an integrated circuit package for use with the present invention.

FIG. 1 is a simplified cross-sectional view of an integrated circuit package that is generally designated 30. The integrated circuit package 30 comprises a silicon chip 50, which can be, for example, any integrated circuit component such as a DRAM, an EPROM, a SRAM or a LOGIC chip. A carrier 70 is attached to the silicon chip 50 by an adhesive layer 60. The adhesive layer 60 may be made of, for example, a double-sided adhesive polyamide tape, adhesive glue or epoxy. The carrier 70 is depicted having a single layer, however, it may comprise a number of different layers depending on the electrical connections that may be necessary to electrically connect the bonding pads 120 to the terminals 100.

The carrier 70 may be constructed from printed circuit board, a material such as FR-4 which is available from, for example, Motorola Inc., U.S.A. FR-4 is an epoxy resin reinforced with a woven glass cloth. In selecting the material for carrier 70, one skilled in the art will recognize that four parameters should be considered, namely, thickness, dielectric constant, glass transition temperature and the coefficient of thermal expansion.

Thickness is dependant on the number of layers required and the amount of reinforcement used in a given layer. The reinforcing glass cloth can range in thickness from 2 mil per sheet (type 106) to about 8 mil per sheet (type 7628) Dielectric constant is determined by a combination of the resin used and the thickness and type of reinforcement used. Standard FR-4 has a dielectric constant of about 4.5. This constant can be reduced to about 3 by replacing the epoxy resin with a cyanate ester resin. The greater the thickness, however, the greater the problems associated with thickness control, rough surfaces, excessive drill wear and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/° C. A difference in the coefficient of thermal expansion between the carrier 70 made from FR-4 and the silicon chip 50 can lead to failure of the integrated circuit package 30 during, not only the assembly of the integrated circuit package 30, but also during the use of integrated circuit package 30.

The adhesive layer 60 may be Hitachi HM122u manufactured by Hitachi Chemical Company of Tokyo, Japan. Alternatively, the silicon chip 50 can be adhered to the carrier 70 with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the carrier 70 at 160° C. for 5 seconds with an applied force of 1000–3000 grams; then attaching the silicon chip 50 on the film at 220° C. for 5 seconds under a force of 150–200 grams.

DF-335 has the following properties

| Test | Remarks | Units | DF-335 |
|---|---|---|---|
| Appearance | Visual | — | silver film |
| Solid Content | 200° C. - 2 h | wt % | ≧96 |
| Ash Content | 600° C. - 1.5 h | wt % | 40 |
| Ash Content/Solid | 600° C. - 1.5 h | wt %/solid | 42 |
| Thickness | Dial gauge | μm | 25 |
| Tensile Strength | R.T. | kgf/mm$^2$ | 7.1 |
| Tensile Modulus | R.T. | kgf/mm$^2$ | 271 |
| Die shear strength | 4 × 4 mm chip/Ag plated alloy 42 | kgf/chip | |
| R.T. | | | ≧10 |
| 250° C. | | | 0.9 |
| Peel strength 240° C. (after/ 85° C. 85%, 48 h) | 8 × 8 mm chip/bare alloy 42 | kgf/chip | ≧3.0 |
| Tg | TMA, 180° C. - 1 h cured | ° C. | 123 |
| Modulus | Viscoelastic spectrometer | Mpa | 1300 |
| Moisture | 85° C./85% RH, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the carrier 70. Commonly used are adhesive tapes based on elastomers, silicones or acrylics because of their ease of use and easy incorporation into production.

Figure 2:
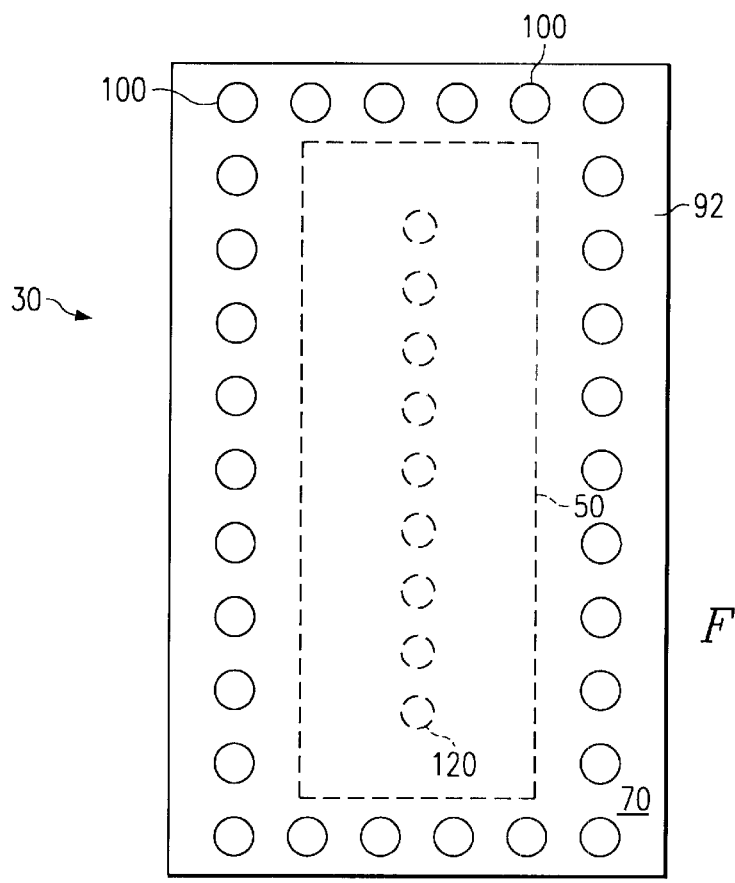
FIG. 2 is a simplified top view of an integrated circuit package for use with the present invention.

Referring collectively to FIGS. 1 and 2, carrier 70 has routing strips 82 that are electrically connected through vias 84 to terminals 100 located on top surface 92 of carrier 70, the bottom surface of carrier 70 being shown by reference 94. It should be understood by one skilled in the art that the terms "top" and "bottom" as well as the terms "side" and "end" are used for illustration purposes only, as the integrated circuit package 30 of the present invention can be assembled and used in a variety of positions and ways.

Carrier 70 may include a pair of bus bars (not depicted). The bus bars are electrically connected through conduits (not depicted) and/or vias 84 to one or more of the terminals 100. The bus bars may serve, for example, as power supplies or grounds, and it is preferred that one bus bar serve one function, such as a power supply, and the second bus bar serve another function, such as a ground.

The silicon chip 50 has bonding pads 120 located generally in the central area of silicon chip 50. The bonding pads 120 are connected to routing strips 82 and bus bars by solder bonding 80. The solder selected for use with the present invention will depend on the temperature requirements of the silicon chip 50.

Solder balls 150 are located on terminals 100 to allow integrated circuit package 30 to be attached to other integrated circuit packages 30, and to a mother or sister board of a single unit. The number of integrated circuit packages 30 that are stacked will depend on, e.g. the memory and contact requirements of an integrated circuit memory module, however, in one embodiment of the present invention the number of integrated circuit packages is eight or nine.

The above described components and their constructions and interrelation provide an assembly that is encapsulated as described below. The term "assembly" refers to the assembled components prior to encapsulation. The assembly consists of carrier 70, adhered silicon chip 50 and solder bonding 80.

The solder bonding 80 process may begin after silicon chip 50 has been adhered to carrier 70. Silicon chip 50 and carrier 70 are then positioned on a heated pedestal to raise the temperature of the combined unit. The solder bonding 80 and solder balls 150 used to create the integrated circuit package 30 for use with the present invention may be attached using conventional solder reflow systems. For example, a vapor phase solder reflow system may be used, which condenses vapor to surround the integrated circuit package 30 and the carrier 70 with a cloud of steam. A liquid, such as a nonchlorinated (non CFC) fluorocarbon is first heated with enough energy to form a vapor and to sustain a vapor cloud. When the integrated circuit package 30 is then passed through the vapor, the vaporized liquid condenses thereon and gives off the latent heat of vaporization. This energy is then transferred to the integrated circuit package 30. As long as the integrated circuit package 30 remains in the vapor, the vapor continues to give off energy at a repeatable fixed rate and temperature, until the integrated circuit package 30 reaches the temperature of the vapor. Likewise the entire assembly of integrated circuit packages may be introduced into the solder melting chamber after being stacked.

The advantage of using a nonchlorinated fluorocarbon is that it is extremely thermally stable, colorless, odorless and nonflammable. In addition, it has a low toxicity, low surface temperature, low boiling point, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the non-chlorinated fluorocarbons that are used as vapor fluids is shown below.

Vaporization Temperatures and Solder Types

| Fluid Temperature | Solder Type |
|---|---|
| 56, 80, 97, 101, 102° C. and 155° C. | 100 In |
| | 37 Sn/38 Pb/25 In |
| 165° C. | 70 Sn/18 Pn/12 In |
| | 70 In/30 Pb |
| 174° C. | 60 In/40 Pb |
| 190° C. | 90 In/10 Ag |
| | 50 In/50 Pb |
| | 63 In/37 Pb |
| | 70 Sn/30 Pb |
| | 60 Sn/40 Pb |
| 215° C. and 230° C. | 60 Sn/40 In |
| | 60 Sn/40 Pb |
| | 63 Sn/37 Pb |
| | 70 Sn/30 Pb |
| | 62 Sn/36 Pb/2 Ag |
| 240° C. and 253° C. | 75 Pb/25 In |
| | 81 Pb/19 In |
| 260° C. and 265° C. | 96.5 Sn/3.5 Ag |

Alternatively, infrared or radiant heated solder reflow may be used. In such a system each component of the soldering system is directly exposed to radiation from a heating element. Heat from the radiant energy element is absorbed by the different components according to its molecular structure.

Conventional radiant heat systems expose only the outer surfaces of the components to the radiant heat, which may not reach interior areas as efficiently as with vapor saturated heating methods as described above. The present invention, however, is not affected by this typical problem because of the use of solder instead of leads or wire bonding. In fact, due to the reduced overall size either method, vapor phase solder reflow or radiant heated solder reflow, may be effectively used with the present invention.

In one embodiment of the present invention eutectics having different melting temperatures may be used for the solder bonding 80 and the solder balls 150. Factors used to determine the relative melting temperatures for the solder bonding 80 and the solder balls 150 will include the relative operating temperature and the amount of encapsulation, if any, of the integrated circuit package 30 components. Also a factor, is the total number of reflow steps to which the solder bonding 80 and/or the solder balls 150 will be exposed. If the solder bonding 80 and the solder balls 150 are exposed to the same number of heat reflow steps, as is the case where all the components are reflowed at the same time, then the same eutectic may be used. If one of the other component is exposed to one or more heat reflow steps prior to final assembly, then different eutectics may be chosen. For example, of the solder bonding 80 is to occur before the solder balls 150 are attached, then a eutectic having a higher melting temperature may be chosen for the first heat reflow step in order to prevent a second melting of the solder bonding 80.

Figure 3:
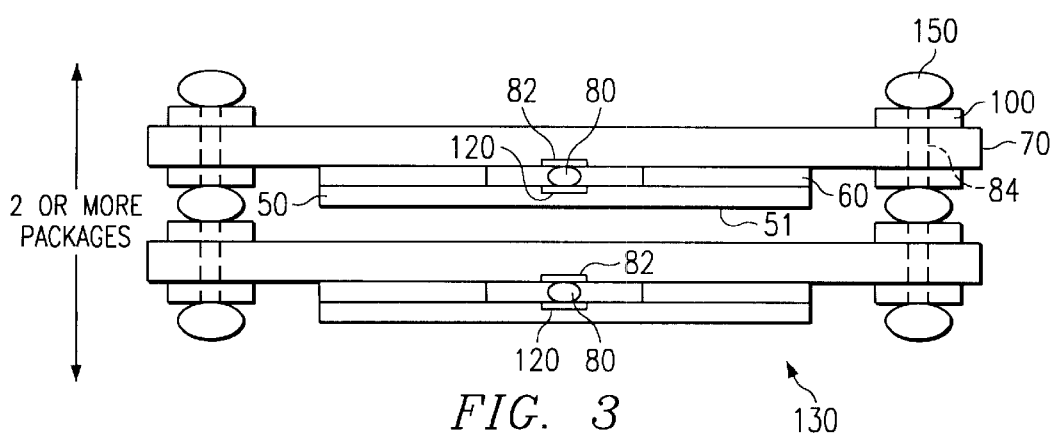
FIG. 3 is a simplified end cross-sectional view of an integrated circuit unit having a plurality of integrated circuit packages oriented in a stacked configuration electronically connected together with solder balls.

In FIG. 3, one embodiment of a three dimensional integrated circuit module is depicted in a simplified cross-sectional view and is generally designated 130. A silicon chip 50 is electronically connected to the circuit 70 by means of solder bonding 80 and mechanically attached by adhesive layer 60. Integrated circuit package 30 is then interconnected with other integrated circuit packages 30 using solder balls 150. Solder balls 150 replace the leads used to connect conventional integrated circuit packages to, for example, a mother or a sister-board. The use of solder balls 150 reduces the overall profile of the integrated circuit package 30 and the integrated circuit module 130. It can be seen that chip 50 has an exposed backside 51, such that the chip 50 can be directly cooled by air flowing between packages.

Figure 4:
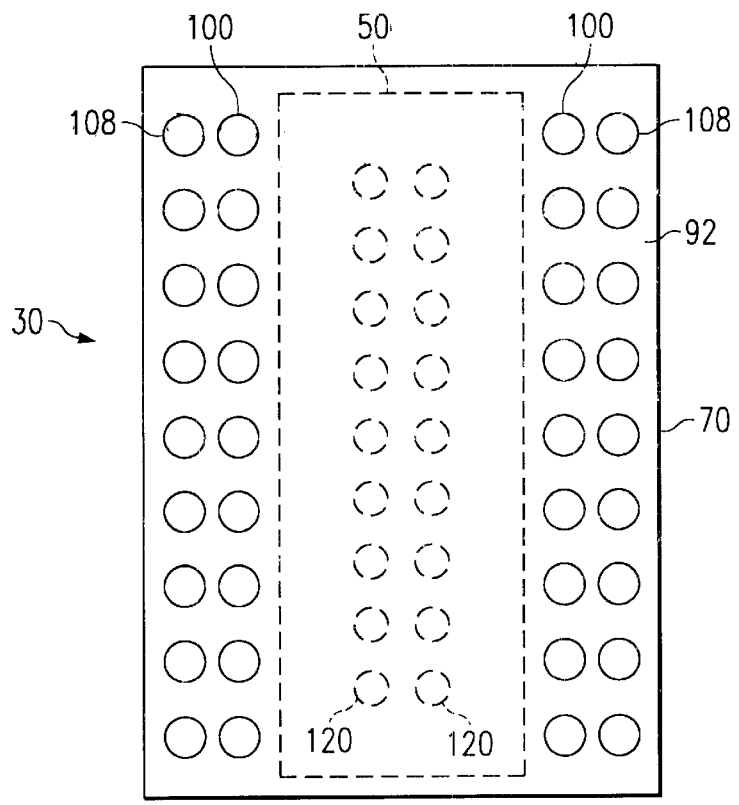
FIG. 4 is a simplified end cross-sectional view of an alternative integrated circuit package.

FIG. 4 is a simplified top view of an alternative embodiment of an integrated circuit package 32 for use with an integrated circuit module. The integrated circuit package 32 has a carrier 70 that is attached to a silicon chip 50 by an adhesive layer 60.

Two rows of terminals 100, 108 are located on each side the carrier, namely, top surface 92 and bottom surface 94 of carrier 70. The first row of solder balls 150 is located on terminals 100. The second row of solder balls 150 is located on terminals 108. Terminals 100 may be electrically connected to terminals 108 by conduits (not depicted). The terminals 108 that are located on top surface 92 may be electrically connected through vias 84 or conduits (not depicted) to the terminals 108. Vias 84 can interconnect the terminals 100, 108 on the top surface 92 with the terminals (100) on bottom surface 94. Again, it can be seen that chip 50 has an exposed backside 51, such that the chip 50 can be directly cooled by air flowing between packages.

Figure 5:
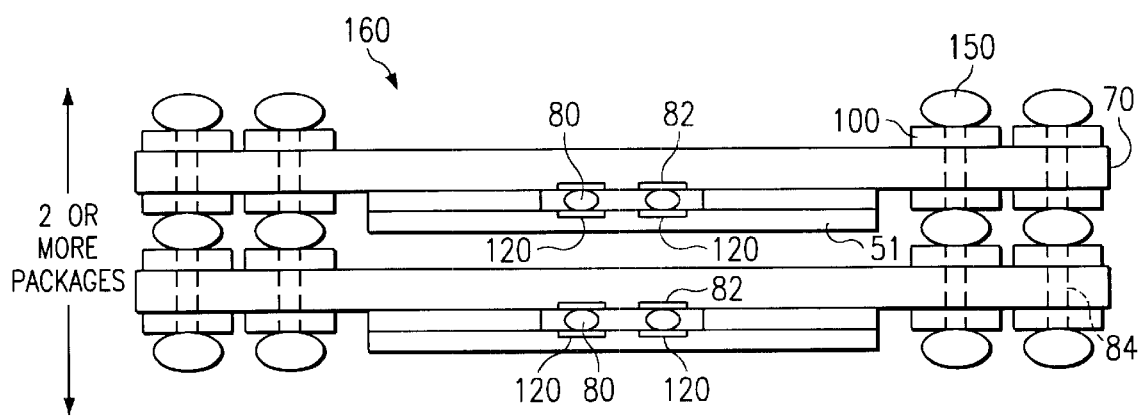
FIG. 5 is a simplified end cross-sectional view of an alternative embodiment of the integrated circuit unit having a plurality of high density integrated circuit packages oriented in a stacked configuration electronically connected together with solder balls.

In FIG. 5, one embodiment of a three dimensional integrated circuit unit is depicted in a simplified cross-sectional view and is generally designated 150. A silicon chip 50 is electronically connected to the carrier 70 by means of solder bonding 80 and mechanically attached by adhesive layer 60. Integrated circuit package 32 is then interconnected with other integrated circuit packages 32 using solder balls 150. Solder balls 150 replace the leads used to connect conventional integrated circuit packages to, for example, a mother or sister board. The use of solder balls 150 reduces the overall profile of the integrated circuit package 32 and the integrated circuit memory module 160.

The present invention also can solve other problems associated with solder reflow systems. These problems include the creation or failure due to voids, coplanarity, tombstoning, open joints, component cracking, thermal shock and thermal stressing. The present invention can solve these problems because it dispenses with the need for electrically connecting the silicon chip 50 to the carrier 70 using wire bonding. The present invention also eliminates the need to electrically connect integrated circuit packages using soldering leads. By using solder bonding 80 and solder balls 150 instead of wire bonding or leads, respectively, the problems associated with voids around terminal areas or under leads caused by incomplete reflow or poor welding of the soldering surface due to improper flux or badly oxidized surfaces is eliminated. The problems of coplanarity and tombstoning are also reduced or eliminated using the solder balls 150 because surface tension on both sides of the solder balls 150 is equal. Also, the problem of stitching a very fine wire bond that can be easily broken by slight mechanical stress is further eliminated.

Open joints are usually caused by problems with coplanarity, while cracking may occur when trapped moisture within an integrated circuit package expands as the device is heated for reflow. The increase in internal pressure, causes the integrated circuit package to split open, usually at one of the corners. The splitting of the package causes solder bonding from the lead frame to the silicon chip to break and in some cases the silicon chips have cracked due to the warpage at the top of the package as the temperature differentials between the top and the bottom of the device cause different rates of expansion.

Using the present invention, the two surface temperature differentials that occurs are between the solder bonding 80 and the carrier 70 or the solder ball 150 and the carrier 70. By isolating the reflow steps and using different eutectics, or by concurrently reflowing both solder bonds 80 and solder balls 150 when using either vapor phase solder reflow or radiant heat solder reflow the present invention can be electrically connected.

The small size of the solder bonds 80 and the solder balls 150, and of the integrated circuit package 30 as a whole, allows for any of the reflow systems to be used with the because the temperature differential between the components is almost negligible.

Although the board-on-chip layout of integrated circuit package 30 has been described using centralized bonding pads 120, it should be understood by one skilled in the art that the principles of the present invention are applicable to a silicon chip 50 with bonding pads 120 in alternate layouts such as positioned along the sides of the silicon chip 50.

Also, it should be noted by one skilled in the art that terminals 100 and bus bars may be located on a single layer of carrier 70. Generally, a layer of insulated tape or coating may be placed on the bus bars to provide for electrical isolation. The advantage of a multi-layer carrier 70, however, is the elimination of the need to insulate the bus bars. The present invention disposes with the need for isolation. Additionally, the multi-layer carrier 70 provides a greater process margin for solder bonding 80. Additionally, reduced environmental impact is obtained using the method and apparatus of the present invention due to the overall decrease in the size of the integrated circuit package 30.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A process for producing a high density unit comprising the steps of:

providing a first integrated circuit package comprising a first carrier having first and second opposing surfaces, each surface having a pair of opposing end portions with terminals on both said opposing surfaces and at both of said opposing end portions with a first interconnect disposed in said first carrier extending to at least one of said terminals on each of said first pair of opposing surfaces;

providing a semiconductor chip having a bonding pad, said semiconductor chip attached to said carrier by an adhesive layer and electrically connected to said carrier by solder bonding;

providing a first interconnection stackably and electrically connecting said semiconductor chip bonding pad to said first interconnect by a routing strip in said first carrier, wherein said routing strip is connected to said first interconnect, wherein said bonding pad and said routing strip are only located in the central portion of said semiconductor chip and said first carrier; and providing a solder ball connected to said terminals on both of said surfaces.

2. The process as recited in claim 1 further including the step of stackably and electrially connecting a third intergrated circuit packages to said first and second integrated circuit packages.

3. The process as recited in claim 1 wherein the step of stackably and electrically connecting further includes connecting at least six integrated circuit packages to said first and second integrated circuit packages to form an eight integrated circuit unit.

4. The process as recited in claim 1 wherein the step of stackably and electrically connecting further includes connecting at least seven integrated circuit packages to said first and second integrated circuit packages to form a nine integrated circuit package unit.

5. The process as recited in claim 1 wherein the step of stackably and electrically connecting said integrated circuit packages is further defined as using solder columns to connect said integrated circuit packages.

6. The process as recited in claim 1 wherein the step of stackably and electrically connecting said integrated circuit packages is further defined as using solder balls to connect said integrated circuit packages.

7. A process for producing a high density unit comprising the steps of:

providing a first carrier having a first pair of opposing surfaces, each surface having an end portion with a terminal at said end portion on said opposing surface;

providing a first interconnect disposed in said first carrier extending to said terminal on each of said first pair of opposing surfaces;

providing a first semiconductor chip having a bonding pad, said first semiconductor chip attached to said first carrier by an adhesive layer;

providing a first interconnection electrically connecting said first semiconductor chip bonding pad to said first interconnect by a routing strip in said first carrier, wherein said routing strip is connected to said first interconnect, wherein said bonding pad and said routing strip are only located in the central portion of said semiconductor chip and said first carrier; and providing solder elements connected to said terminals on both off said surfaces.

8. The process of claim 7 wherein said solder elements are solder balls.

9. The process of claim 7 wherein said solder elements are solder columns.

\* \* \* \* \*